United States Patent [19]

Cronin

[11] 4,404,903
[45] Sep. 20, 1983

[54] AUTOMATED SCREENER

[76] Inventor: John V. Cronin, 2215 Port Lerwick, Newport Beach, Calif. 92660

[21] Appl. No.: 346,661

[22] Filed: Feb. 5, 1982

Related U.S. Application Data

[63] Continuation of Ser. No. 103,755, Dec. 14, 1979, abandoned.

[51] Int. Cl.³ .............................................. B41L 13/18
[52] U.S. Cl. .................................. 101/123; 101/126; 101/129
[58] Field of Search ................ 101/114, 123, 126, 129

[56] References Cited

U.S. PATENT DOCUMENTS

| | | | |
|---|---|---|---|
| 1,840,073 | 1/1932 | Williams | 101/123 |
| 2,039,909 | 5/1936 | Kem | 101/123 |
| 2,355,930 | 8/1944 | Throne | 101/123 |
| 2,917,997 | 12/1959 | Black | 101/123 |
| 2,963,964 | 12/1960 | Klump | 101/126 |
| 2,975,705 | 3/1961 | Gilman | 101/123 |
| 3,166,011 | 1/1965 | Landsman | 101/123 |
| 3,483,819 | 12/1969 | Hughes | 101/123 |
| 3,828,671 | 8/1974 | Fuchs | 101/123 |
| 3,943,849 | 3/1976 | Vasilantone | 101/123 |

FOREIGN PATENT DOCUMENTS

| | | | |
|---|---|---|---|
| 1110179 | 7/1961 | Fed. Rep. of Germany | 101/123 |
| 347162 | 8/1960 | Switzerland | 101/123 |

Primary Examiner—Clyde I. Coughenour
Attorney, Agent, or Firm—Nilsson, Robbins, Dalgarn, Berliner, Carson & Wurst

[57] ABSTRACT

An automated screener in which print and flood squeegees are sequentially driven across a stencil screen framed in a chase. After a print stroke, the print squeegee is retracted and the chase is raised a short distance to make contact with the flood squeegee, which is driven in a flood stroke, whereupon the chase is raised further to an open position for removal of the stenciled workpiece. Means are provided for adjusting the print and flood squeegees and for limiting upward movement to predetermined levels during operation of the screener. Particular details relate to an arm carrying the print and flood squeegees over the chase screen. To prevent relative vertical movement between the chase and arm, both are pivoted around a common axis. Translation of the arm across the chase is accomplished by connection to a motor drive chain by means of a hingedly connected pin bearing member which permits the arm to be readily released from the chain when the arm is swung away from the chase.

30 Claims, 19 Drawing Figures

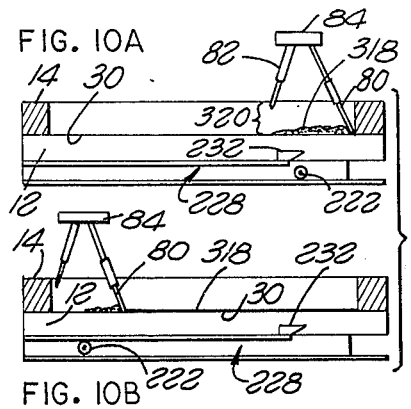
FIG. 10A
FIG. 10B
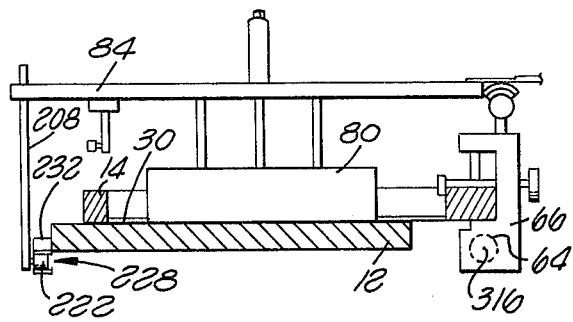
FIG. 10
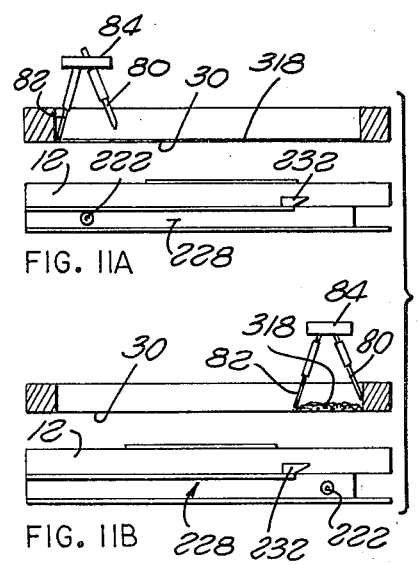
FIG. 11A
FIG. 11B
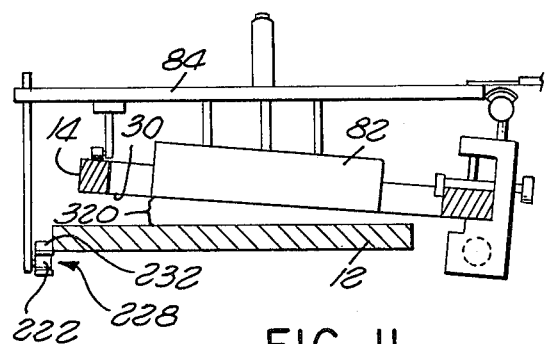
FIG. 11
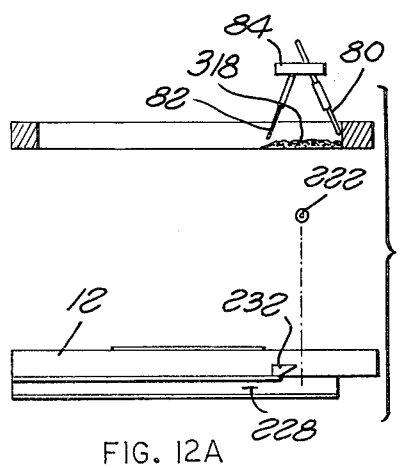
FIG. 12A
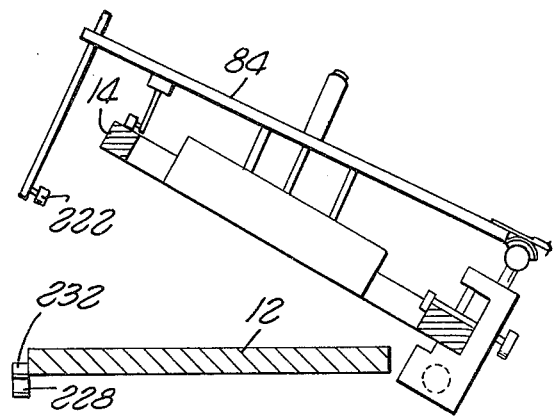
FIG. 12

AUTOMATED SCREENER

This is a continuation of application Ser. No. 103,755, filed Dec. 14, 1979, now abandoned.

FIELD OF THE INVENTION

The field of art to which the invention pertains includes broadly the field of printing and more narrowly stenciling such as printing by silk screening.

BACKGROUND AND SUMMARY OF THE INVENTION

This invention relates to an automatic stenciling device, more commonly referred to as a silk screening jig. A variety of jigs are available designed to facilitate the alignment of a stencil screen over a workpiece to be stenciled. Such jigs are particularly useful in that a silk screening operation requires a high degree of precision, such as in silk screening printed circuits. An example of such a jig is a device manufactured by American Circuit Tool, Santa Ana, Calif., and sold under the trademark "Printmaster 5000" in which a chase framing a stencil screen is pivotally secured at a rear edge and rotatable upwardly relative to a table surface. The table is accurately adjustable to precisely position the workpiece under the screen. When the chase is in a closed position, printing fluid placed on a first end of the screen is spread by a squeegee in a print stroke and applied to the workpiece through selectively open portions of the screen. Thereafter the chase can be lifted from the workpiece a distance sufficient to enable a squeegee to sweep back the printing fluid in a flood stroke. Such a jig greatly facilitates silk screening operations, printing time and rework costs in that positioning and repeatability are assured. However, while a substantial advantage is obtained by use of such a jig, nevertheless there still remains a number of steps to be done manually, for example, raising the chase to an appropriate intermediate position, and properly applying squeegees during print and flood strokes. Particularly with the use of squeegees, manual application requires a great deal of dexterity and skill. The operator must apply appropriate pressure and use the squeegee at the proper angle, and do so time and again without substantial variation. Such high level of skill requires extensive training and experience; opertors who exhibit such skills command very high hourly rates, all contributing to high unit costs.

The present invention overcomes these drawbacks by automating the operation of such silk screening jigs. A high precision, semi-automatic screener is provided in which not only is the raising and lowering of the chase automated but the print and flood strokes are also automated, permitting accurate adjustment to desired print and flood angles, positions and pressures with reliable repeatability. As a result, ease of operation is greatly improved assuring a high quality product from personnel which can be relatively inexperienced and without the great manual skills and dexterity required of operators of manual jigs.

Certain features of the present invention have applicability to jigs regardless of how the chase is raised, whether by pivoting, as in the Printmaster 5000, or by raising from the table by any other means. Other aspects of the invention are more pertinent to a jig in which upward movement of the chase is by pivoting. In general terms, the present invention is an improvement to a jig or screener in which a chase for framing a stencil screen is movable relative to a table surface, from an open position permitting a workpiece to be placed on, or withdrawn from, the table surface, to a closed position in which the screen will contact the workpiece during a print stroke. With such jigs, a print stroke is executed when the chase is in its closed position, printing fluid on a first end of the screen being spread by a squeegee and applied to the workpiece through the screen. Thereafter, the chase is moved from the closed position and the printing fluid is swept back by a squeegee in a flood stroke. The improvement herein results in automation of operation of such a screener and comprises means for accomplishing a sequential series of steps. In particular, means are provided to move the chase to and from the open and closed positions. When the chase is in the closed position, a print squeegee is supported over the screen so that the bottom edge of the squeegee is in contact with the screen. Means are provided for retracting the print squeegee from the screen after the print stroke. At that point, the chase is raised, but upward movement of the chase is limited. Specifically, movement of the chase is limited to a distance which is a fraction of the distance from the table surface to the chase in its open position, but sufficient so that the screen is raised from the workpiece. A flood squeegee is supported over the screen and spaced therefrom so that when the screen is raised, contact is made between the bottom edge of the flood squeegee and screen whereupon the flood squeegee is driven in a flood stroke across the screen. Thereafter, the chase can be raised to the open position, whereupon the stenciled workpiece can be removed and another workpiece inserted.

While as above indicated, aspects of the invention have broad application to a jig in which the chase is raised by any mechanism, the invention is particularly applicable to a jig of the Printmaster 5000 type, in which the stencil screen is pivotally secured at a rear edge for rotatable movement upwardly relative to a table surface. In this configuration, the present invention is designed so as to prevent relative movement between the chase and the print and flood squeegees, by pivoting both the squeegee assembly and the chase around a common axis. An axial bar, defining the common axis is disposed below the rear edge of the chase extending along at least a portion of the chase. Clamps are used to rigidly secure the chase to the axial bar. The squeegees are supported by an arm which extends across the chase. The arm and squeegee assembly is rigidly secured to a bearing which is slidably and pivotally disposed on a cylindrical bearing bar extending across the rear edge of the chase and which in turn is rigidly secured to the clamp members. As a result, as the chase is raised, the squeegee and arm assembly is pivoted about the bearing bar, with both the chase and arm assembly rotating around a common axis. This arrangement also permits the squeegee-arm assembly to be swung out of the way by rotating upwardly to an obtuse angle with respect to the table when the chase is in its open or closed position.

The squeegee-arm assembly is driven by connection to a motor-driven drive chain extending along the rear edge of the chase. Specifically, the arm carries a member having at least one pin for linking with the chain. The pin-bearing member is hingedly connected to the top rear surface of the arm so that as the arm is rotated upwardly, the pin-bearing member moves in a vertically downward direction while remaining horizontal, thereby enabling the arm to be released from the chain. A mechanism is thereby provided which drives the arm in translation across the chase yet which rapidly and readily releases the arm when it is desired to swing the arm out of the way.

Both the print squeegee and flood squeegee are adjustably supported over the screen, dependent from the arm. The print squeegee is controlled by a pneumatic cylinder secured to the arm. The pneumatic cylinder has a piston shaft extending downwardly and connected to the top of the print squeegee. Means are also provided for separately adjusting the height of the front and rear edges of the print squeegee so that the bottom edge of the print squeegee can be accurately positioned on the screen. A switch is provided which is responsive to the end of a print stroke for actuating the pneumatic cylinder to retract the print squeegee.

The flood squeegee is adjustably spring-loaded on the arm and is disposed so that its lower edge is at a predetermined distance from the screen when the chase is in its closed position. This distance corresponds to a distance through which the chase is raised after a print stroke so that, following the print stroke, the screen is brought into contact with the flood squeegee simply by raising the chase. The flood squeegee is adjustable so that its front end is at a higher position than its rear end relative to the table; the angle formed by the bottom of the flood squeegee can be adjusted relative to the table to correspond to the angle defined by raising the chase said predetermined distance.

Upward movement of the chase is governed by a pair of limit members which depend from the arm and engage the table and chase at various stages. A first limit member depends from the squeegee arm directly over the forward edge of the chase. It has a follower, in the form of a roller, on its lower edge which makes contact with the chase when the chase is raised said predetermined distance. A second limit member depends from the squeegee arm at a position forward of the first limit member and extends downwardly past the edge of the chase. It too is formed with a roller as follower which engages a channel member that extends parallel to the direction of translation of the arm. The channel member can be supported by any means, such as by the jig, below the table. The channel prevents vertical movement of the squeegee arm during the print and flood strokes, but is formed with a discontinuous portion at a region which corresponds to the end of the flood stroke. At the discontinuous portion, the second limit member is released, permitting the chase to be raised to its open position. In operation, the chase is lowered to its closed position, and a print stroke is initiated, the follower of the second limit member engages the channel so that during the print stroke the squeegee-arm assembly is prevented from moving vertically while being permitted to translate across the chase. At the end of the print stroke, while the second limit member is still engaged in the channel, the chase is raised, but its upward movement is limited by the first limit member. In other words, as it moves upwardly, the upper edge of the chase engages the follower of the first limit member preventing further movement and locating the screen so that it is in contact with the bottom edge of the flood squeegee. At that point, the motor is reversed so that the flood squeegee is driven in a flood stroke across the screen. When the arm has translated sufficiently across the chase to complete the flood stroke, the follower on the first limit member meets the discontinuous portion of the channel where it is released, allowing the chase and the squeegee-arm assembly to pivot upwardly in unison.

BRIEF DESCRIPTION OF THE DRAWINGS

FIG. 10 is a cross-sectional, schematic side view of the squeegee-arm assembly, chase, limit members and table when the chase is in a closed position;

FIGS. 10A and 10B are cross-sectional, schematic front views of the squeegee assembly, chase and table, at the beginning and end, respectively, of a print stroke;

FIG. 11 is a cross-sectional, schematic side view of the squeegee-arm assembly, chase, limit members and table when the chase has been released to its intermediate stage, during a flood stroke;

FIGS. 11A and 11B are cross-sectional schematic front views of the squeegee assembly, chase and table at the beginning and end, respectively, of a flood stroke;

FIGS. 12 and 12A cross-sectional, schematic side and front views, respectively, of the squeegee-arm assembly, chase, limit members and table when the chase is in its open position.

DETAILED DESCRIPTION

Figure 1:
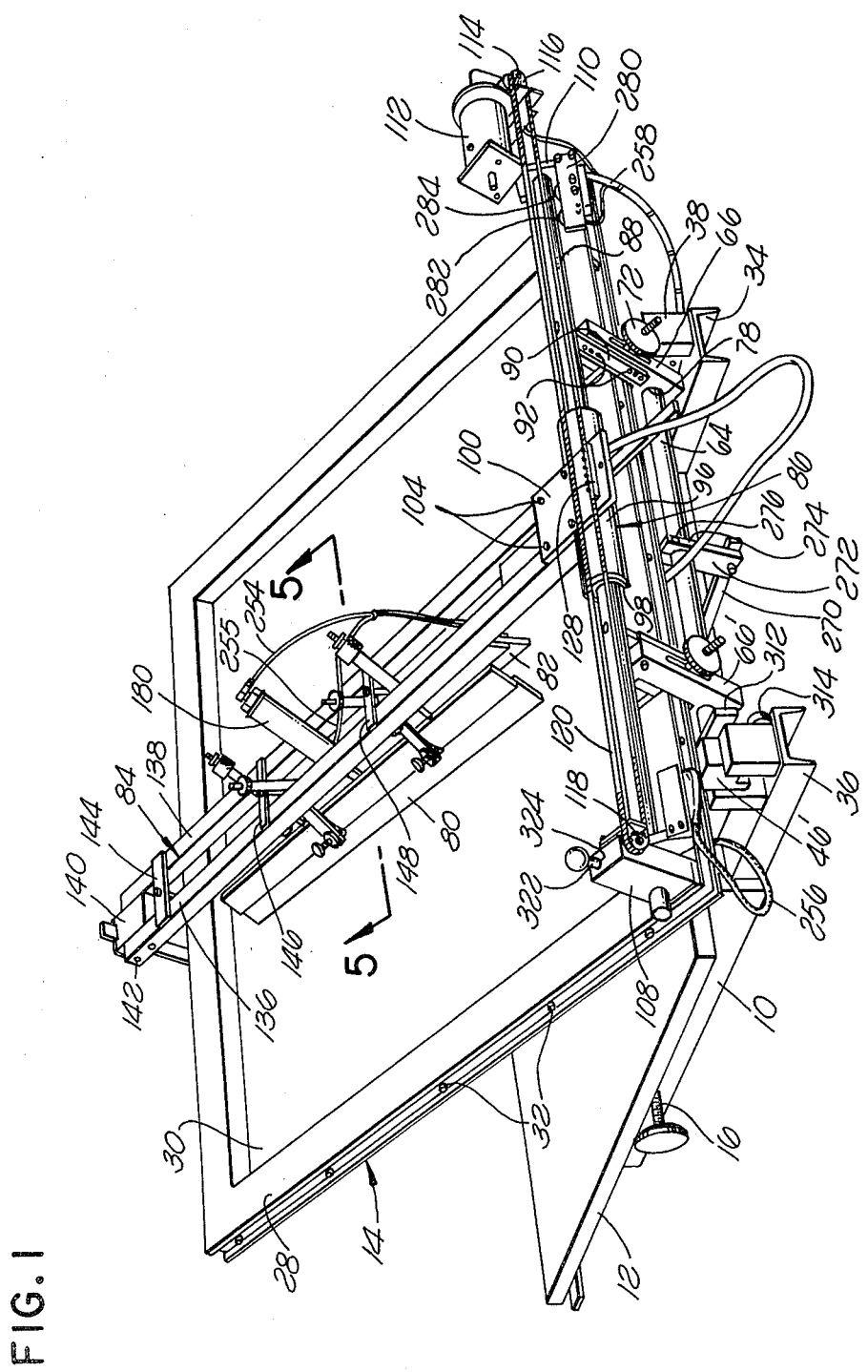
FIG. 1 is a perspective side-top-rear view of a screener constructed in accordance with the present invention.
Figure 2:
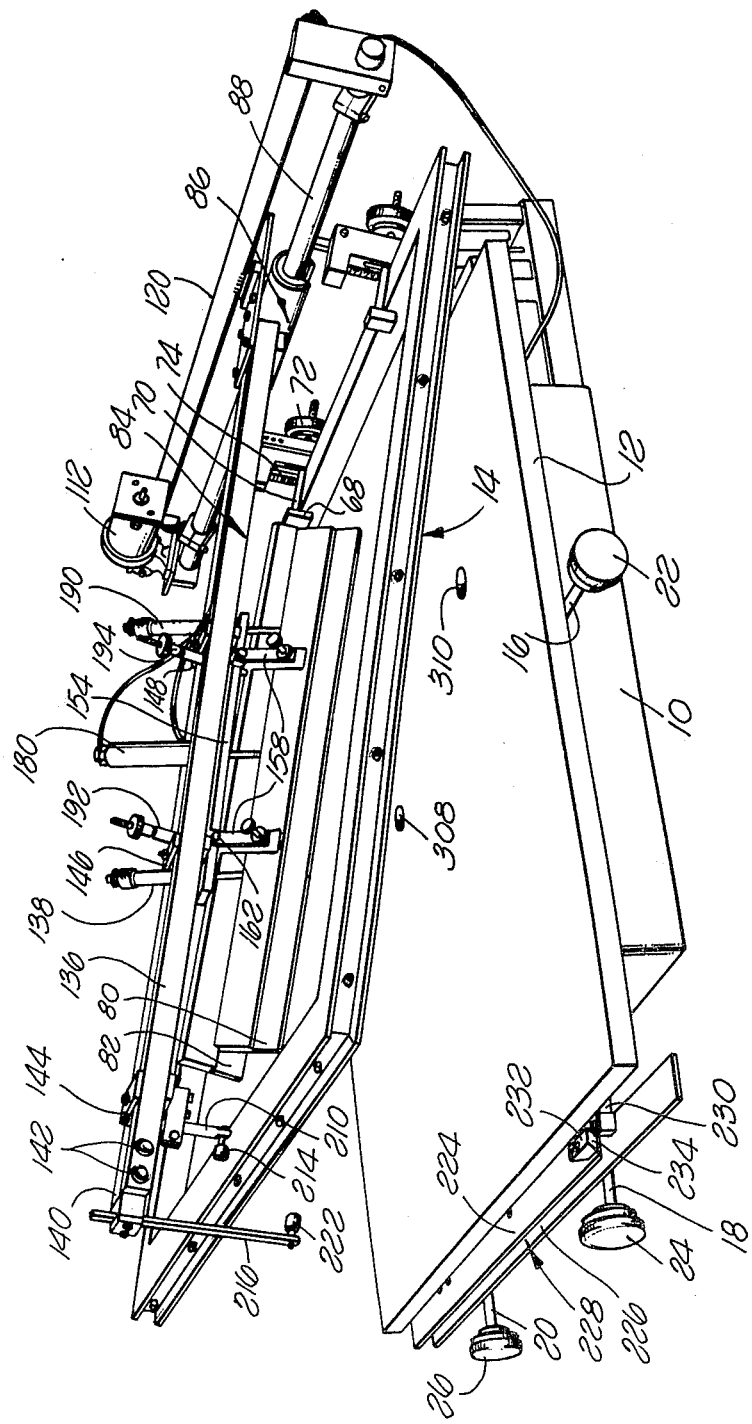
FIG. 2 is a perspective side-top-front view of the screener.

Referring to FIGS. 1 and 2, the silk screening jig of the present invention comprises a base 10 on which is supported a table 12 and a chase 14 secured for pivotal movement with respect to the table 12. The base 10 serves to house an air valve which operates to raise and lower the chase 14, and registration connections for the table 12 and control rods 16, 18 and 20 therefor which extend exteriorly of the base terminating in registration knobs 22, 24 and 26, respectively. Operation of the air valve and registration connections is described in more detail in connection with the description of FIG. 8.

The chase 14 is formed so as to constitute a frame 28 carrying a stenciling screen 30, and is of usual and ordinary construction in which the screen 30 is stretched taut by edge retainers which are inserted in the frame 28 and secured by bolts 32 so that the screen 30 defines the bottom of the chase 14. The chase 14 can be of any of various commercial chases of a suitable size range.

Figure 3:
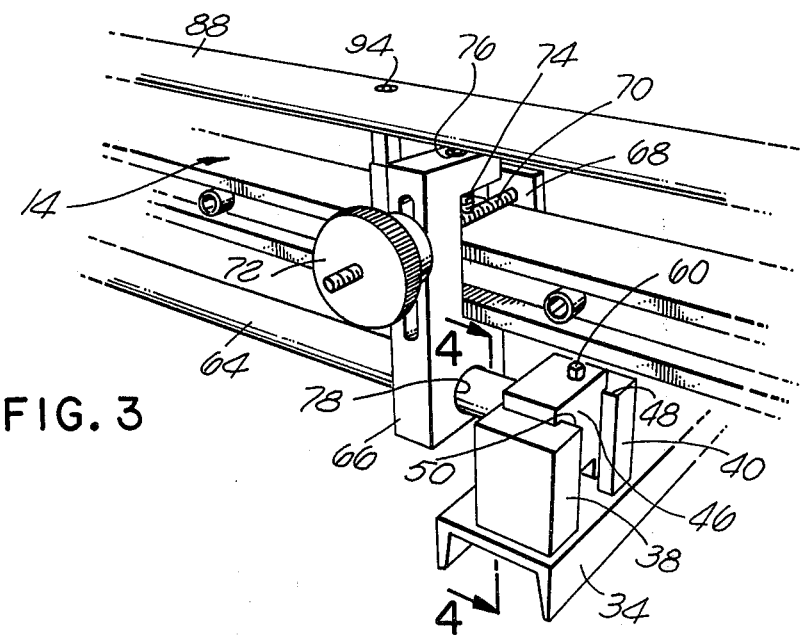
FIG. 3 is a perspective view of a portion of the device showing the bearing bar-clamp-axial shaft-chase assembly.
Figure 4:
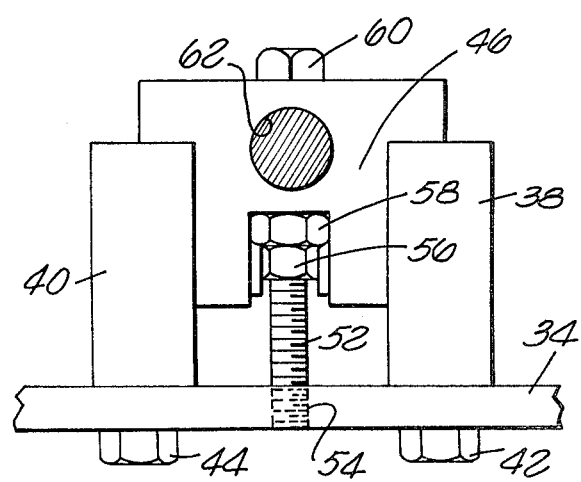
FIG. 4 is a detailed view of the bearing block and retainer assembly taken on the line 4—4 of FIG. 3 in the direction of the arrows.

Referring more particularly to the rear end of the jig assembly, in FIG. 1, and to the details shown in FIGS. 3 and 4, a pair of inverted U-shaped members 34 and 36 extend rearwardly from the base. Describing the right end in FIG. 1, shown in more detail in FIGS. 3 and 4, as representative, the U-shaped member 34 supports a facing pair of block retainers 38 and 40 firmly secured to the U-shaped member by bolts 42 and 44 and spaced apart sufficiently to accommodate a bearing block 46. The jig is thus provided with a pair of oppositely spaced bearing blocks 46 and 46' (FIG. 1), each formed with a cylindrical concavity 62 so that a cylindrical axial shaft 64 can be rotatably supported between the opposed pair of bearing blocks 46 and 46'. The axial shaft 64 serves as a center of rotation not only for the chase but also for an arm which supports the print and flood squeegees, as will be described in more detail hereinafter.

The bearing block retainers 38 and 40 are each formed with a pair of flanges, indicated at 48 and 50, such that the bearing block 46 can slide vertically between them. A bolt 52, having a head 60, is secured in the bearing block 46 by two nuts 56 and 58 so that the bolt can turn but has no movement vertically. By turning the bolt 52 through a threaded portion 54 of the U-shaped member 34, the bearing block 46 can be driven up and down. This lifts the axial shaft 64 and raises the chase 14 and all attached members, pivotally around the bearing block 46'. Conversely, raising or lowering the other bearing block 46' will pivot the axial shaft 64 about the bearing block 46.

Connection between the chase 14 and axial shaft 64 also will be described with respect to FIGS. 1 and 2, as shown in more detail in FIG. 3. Connection is made by means of a pair of C-clamps 66 and 66' each in conjunction with a drawbar clamp 68. The drawbar clamp is applied to the inner edge of the chase and is secured through a hole (not shown) through the associated C-clamps 66 by means of a threaded drawbar rod 70 and knob 72 therefor. A set screw 74 is threadably driven through the top arm of the C-clamp 66 through an opening 76 therethrough, engaging the drawbar rod 70 thereby, in conjunction with the clamping action of the drawbar clamp 68 and knob 72. This results in a very rigid securement of the chase. The lower end of the C-clamp 66 is formed with an opening 78, closely fitting the cylindrical axial shaft 64, on which it rotates.

The silk screening jig of the present invention utilizes a pair of squeegees, specifically, a print squeegee 80 and a flood squeegee 82 which are secured to and dependent from a support arm 84. The support arm 84 is pivotally and slidably secured at its rear end by means of a bearing 86 slidably and pivotally disposed on a bearing bar 88. As illustrated in FIGS. 1 and 2 and in more detail in FIG. 3, the bearing bar 88 is cylindrical and extends across the rear edge of the chase 14, spaced from the top surface of the chase and is rigidly secured to the C-clamps 66 and 66'. More specifically, the bearing bar 88 is secured to the top edge of an extension bar 90, serving as a cleat, attached on one side of each C-clamp by means of machine screws 92. A threaded bolt 94 extends through an opening in the bearing bar, and into the top of the extension bar 90, the top of the bolt 94 lying below the surface of the bearing bar 88 so as to not interfere with slidable movement thereacross of the bearing 86.

The bearing 86 is a partial cylindrical bearing which includes a housing 96 surrounding a linear recirculating ball bushing 98. Thus, the bearing is "cut away" along its bottom segment to pass over the extension bars 90 when traveling across the bearing bar 88.

The partially cylindrical bearing 86 has a horizontal extent wider than the width of the squeegee arm 84. It is connected to the squeegee arm 84 by means of a bridge plate 100. Machine screws 102 (FIGS. 9A and 9B) and 104 (FIG. 1) secure the bridge plate to the top of the bearing housing 96 and the arm 84, respectively. An end portion 106 of the bridge plate extends rearwardly well beyond the bearing housing 86. One purpose of the end portion 106 is to serve as a stop, by contact with the axial shaft 64, against complete rotation or rearward movement of the arm 84.

Figure 9A:
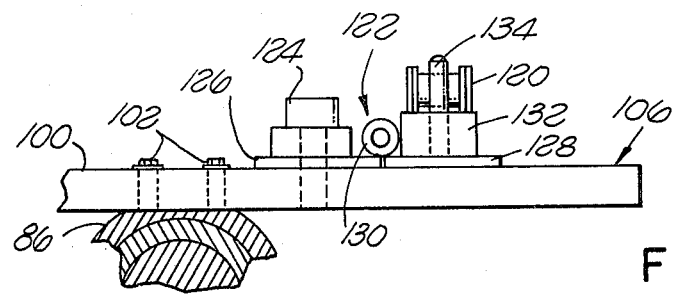
FIGS. 9A and 9B are cross-sectional views, partially in shadow, of the pin bar-chain linkage illustrating connection and disconnection, respectively.
Figure 9B:
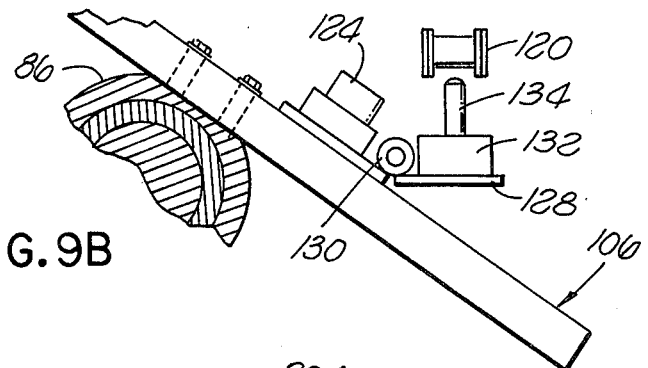

Another purpose of the extended end portion 106 is to facilitate connection of the arm to a motor-driven chain. In this regard, the bearing bar 88 carries a pair of end members 108 and 110 on opposite ends thereof. One of the end members 110 supports an electric motor 112 having a drive shaft 114 on which is carried a drive sprocket. The other end member 108 carries an idler sprocket 118. Looped around the drive and idler sprockets is a drive chain 120. Connection between the squeegee arm 84 and the motor-driven chain 120 is made by means of a pin bar assembly 122. The pin bar assembly includes a retaining edge portion 126 which is secured to the end member 106 by means of bolts such as 124, and a pivotal portion 128 secured to the edge portion 126 by means of a hinge 130. The pivotal portion 128 carries a pin bar 132 formed with a plurality of pins 134 extending upwardly for engagement with the links of the chain 120, as illustrated in FIG. 9A. The assembly includes a hinge so that as the arm 84 rotates upwardly, the pin bar 132 moves in a vertically downward direction while remaining horizontal, as shown in FIG. 9B so as to release the pin bar 132 from the chain 120.

Accordingly, the chain 120 driven by the motor 112 serves to move the arm 84 in translation across the chase 14, by means of connection to the connecting pins 134 and chain 120. When it is desired to swing the squeegee arm 84 out of the way, as illustrated in FIG. 9B, the movement of the arm upwardly results in rotational movement of the end portion 106 thereof downwardly. As a result of the hinging of the pin bar 132, it moves in a generally verticle direction, providing smooth release from the chain 120.

Figure 5:
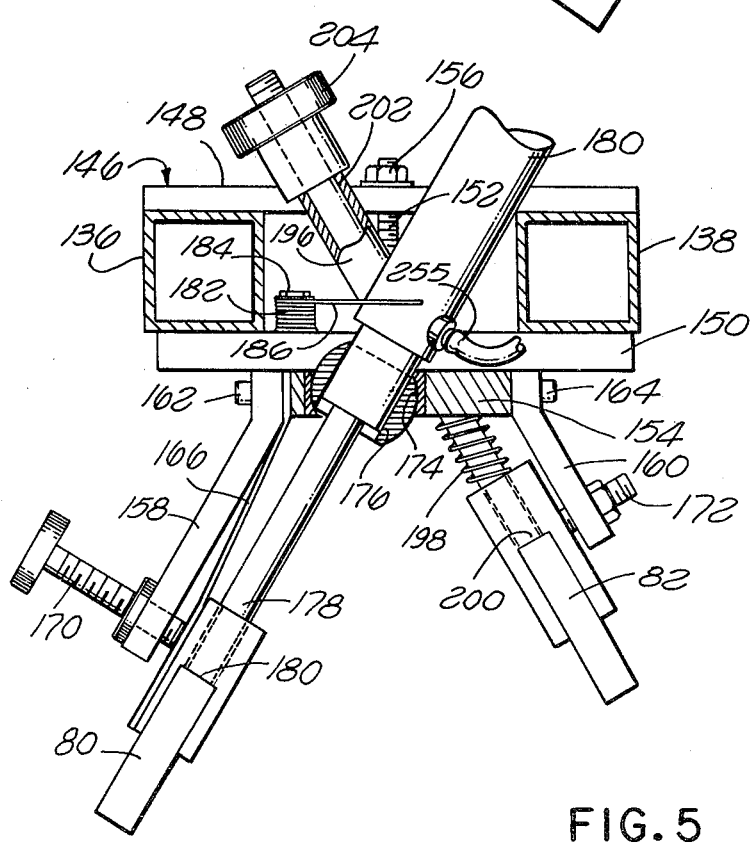
FIG. 5 is a cross-sectional view of the squeegee-arm assembly, taken on line 5—5 of FIG. 1, in the direction of the arrows.

Referring now to FIGS. 1, 2 and 5, the squeegee arm is formed of two parallel, rectangular bars 136 and 138 joined at its rear end by the bridge plate 100 and at its forward end by the bridging member 140 secured by bolts 142. Several bridging clamps 144, 146 and 148 span the bars 136, 138 along the length thereof and serve to support the squeegees and a limit member as will be described in more detail hereinafter.

More specifically, and referring more particularly to FIG. 5, the bridging clamp 146 comprises upper and lower opposed bars 148 and 150, respectively, joined by a central bolt 152 which extends also through a lower support plate 154. The bolt is secured by nuts top and bottom, such as the nut 156 (the nut securing the lower support plate 154 is not shown).

A pair of adjustment clips 158 and a shorter pair 160 are secured to opposite sides of the lower support plate 154 by means of bolts 162 and 164, respectively. The adjustment clips 158 adjacent the print squeegee 80 includes a thin shield strip 166, bearing against the side of the print squeegee 80 supported thereat; and is equipped with an adjustment screw 170. Another adjustment screw 172 bears through a clip 160 against the side of the flood squeegee 82. Rotation of the adjustment screws 170 and 172 adjusts the angle of the respective squeegee.

The support plate 154 is formed with a plurality of openings such as shown at 174, in which are placed swivel bearings, such as are shown at 176. The swivel bearings are formed with a cylindrical opening therethrough. Referring specifically to the swivel bearing shown in FIG. 5, in this case, the piston shaft 178 of a pneumatic cylinder 180 extends through the cylindrical opening in the swivel bearing 176. The end of the piston shaft 178 is threaded and is received into a threaded opening at the top 180 of the print squeegee, located approximately centrally thereof. By such means, the print squeegee is adjustably carried by the squeegee arm 84. The support plate 154 carries upwardly a plurality of spring studs 182, each defined by a flanged bolt 184 having its flanged beads spaced upwardly from the top surface of the support plate 154. The spring stud 182 carries a spring with an outer end 186 bearing against, in this case, the pneumatic cylinder 180 thereby spring-loading the cylinder to an angled disposition in which the print squeegee is pressed against the clip 158. Accordingly, by rotating the adjustment screws 170, the angle or position of the print squeegee can be adjusted against the force of the spring arm 186. The bottom of the pneumatic cylinder 180 bears against the support plate 154 preventing its further movement downwardly so that upon extension and retraction of the piston shaft 178, the print squeegee 80 moves downwardly and upwardly, respectively.

The print squeegee is supported at two additional positions spaced outwardly from the connection to the piston shaft 178, by means of adjustable shaft assemblies 188 and 190 (FIG. 2). Similarly, the flood squeegee 82 is supported by adjustable shaft assemblies 182 and 184. The print squeegee shaft assemblies 188 and 190 and the flood squeegee assemblies 192 and 194 are of identical construction except that the flood squeegee assemblies 192 and 194 incorporate a spring at the lower end of the shaft, spring-loading the flood squeegee 82 to a downward position sufficient to withstand the upward force of flooding pressure, e.g. up to 20 pounds. Whereas the print squeegee is "loaded" by means of the pneumatic cylinder piston shaft, the flood squeegees are not so loaded and therefore require spring-loading to maintain its position. More specifically in FIG. 5, the flood squeegee adjustable shaft assembly includes a shaft threaded 196 extending through a swivel bearing (not shown but similar to the swivel bearing 176). A spring 198 is mounted on the shaft 196 below the support plate 154, and the end of the shaft 196 is threadably received at 200 into the top edge of the flood squeegee 82. A tubular member 202 is carried on the shaft 196 above the support plate and is retained thereon by an adjustment knob 204, threaded onto the top of the shaft 196. By turning the adjustment knob clockwise, the shaft 196 is drawn upwardly through the tubular member 202, thereby raising the flood squeegee against the force of the spring 198.

The adjustable shaft assemblies 188 and 190, associated with the print squeegee, are similarly constructed except that there is no spring 198 associated with the shafts on the print squeegee shaft assemblies 188 and 190; as above indicated, the force of the pneumatic cylinder piston shaft 178 takes the place of the force of the spring 198.

Accordingly, the print squeegee and flood squeegee are both adjustable, both vertically and angularly. Additionally, because the squeegees are provided with pairs of adjustable shaft assemblies, the front and rear ends of the squeegees can be separately adjustable so that they can be independently lowered or raised. The front of the flood squeegee should be disposed at a higher position than the rear of the flood squeegee so that when the chase is in a raised position during a flood stroke, the bottom edge of the flood squeegee 82 is flush with the screen 30.

Figure 6:
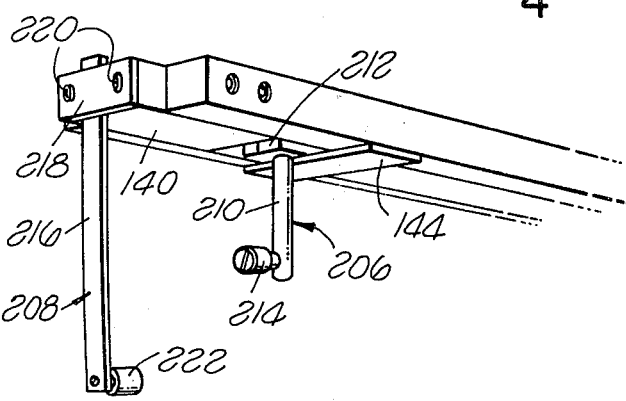
FIG. 6 is a perspective view of a portion of the squeegee arm showing in closer detail the two limit members thereon.

The specific modes of operation of the print squeegee 80 and flood squeegee 82 and their disposition during the various translation stages of the squeegee arm 84, which will be described in more detail with respect to FIGS. 10-12, are determined at least in part by the position of the limit members supported by the squeegee arm 84. Referring to FIGS. 2 and 6, two limit members are provided which may be referred to for convenience as an internal limit member 206 and an external limit member 208. The internal limit member 206 serves to limit the upward rise of the chase 14 and includes a limit bar 210 carried by a retaining block 212 which is clamped between a lower bar of the clamp 144 thereat and the inner side of the bridge member 140. The bottom end of the limit bar is fitted with an outwardly directed follower, in the form of a freely rotatable roller 214. The external limit member 208 is formed with a limit bar 216 which is tightly secured by a bar clamp 218 to the outer edge of the bridging member 140 by means of bolts 220. The external limit bar is formed with an inwardly directed follower, also in the form of a freely rotating roller 222.

Figure 7:
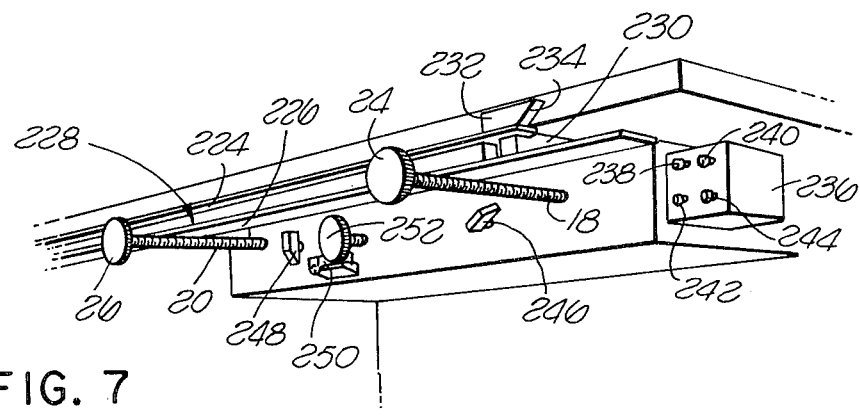
FIG. 7 is a perspective view of the front of the table portion of the device showing adjustment and switching mechanisms.

Referring also to FIG. 7, in conjunction with FIG. 2, the external limit bar roller 222 is designed to fit between a pair of spaced flanges 224 and 226 defining a channel 228. The flanges 224 and 226 are supported below the forward edge of the table 12 by means of struts, such as 230 extending from the base 10. The upper flange 224 is shorter on its right edge than the lower flange 226 and carries on its upper side a lead-in member 232 formed with an angled forward edge 234, to guide the external limit member roller 222 into the channel 228.

A variety of controls are shown in FIG. 7, including a control box 236 which is pneumatically connected to an internal pneumatic cylinder described hereinafter which controls the up and down movement of the chase 14 and is provided with a chase "up" pressure knob 238, a chase "up" speed knob 240, a chase "down" pressure knob 242, and a chase "down" speed knob 244 whereby the pressure and speed of the chase can be controlled. Additional controls include a print stroke speed knob 246 connected to control the speed of the motor 112 in a print stroke mode; a flood stroke speed knob 248 connected to control of the speed of the motor 112 in a flood stroke mode; a motor microswitch 250 connected to control the on-off operation of the motor 112; and a motor actuating knob 252 which when the chase 14 is in its lowermost position, acts to actuate the motor microswitch 250, thereby starting the motor 112, and when the chase is raised, serves to reverse the motor 112, all as will be explained in more detail hereinafter.

Figure 8:
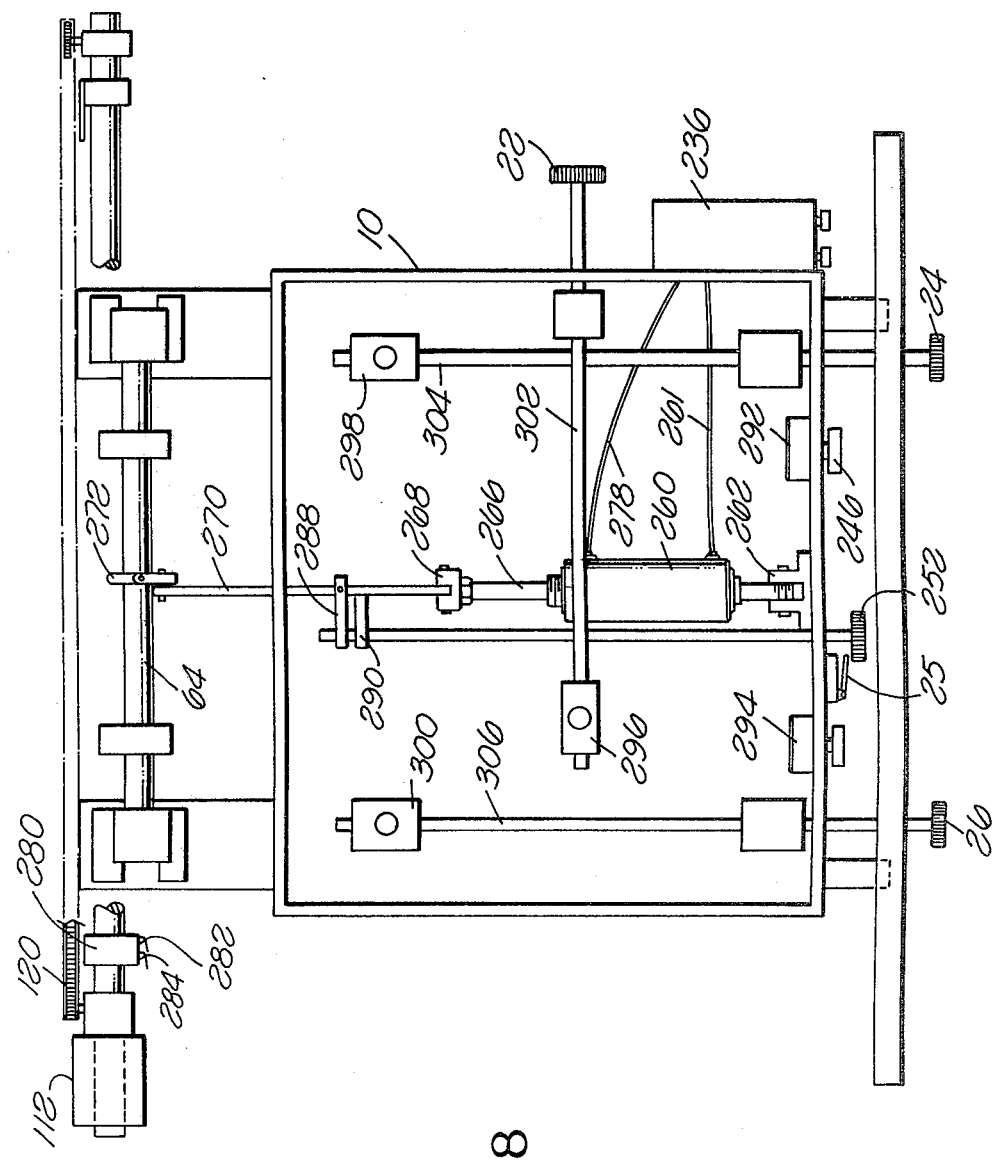
FIG. 8 is a plan, schematic view of the internal layout of the device showing pneumatic operation thereof.

Although the specific wiring and pneumatic connections are not shown, except externally, such as the pneumatic connection illustrated in FIG. 1 at 254 and electrical connections therein at 256 and 258, both the electrical and pneumatic circuits are simple and straightforward. The internal components of the base 10 are shown in FIG. 8 which should be referred to in conjunction with FIGS. 1 and 2. The air box 236 is connected by pneumatic lines (not shown) to an internal pneumatic cylinder 260 which is retained at its rear end by a clevis 262, secured to the front wall 264 of the housing 10. The pneumatic cylinder piston shaft 266 has a clevis 268 at its forward end which in turn is connected to a linkage arm 270 which, at its end, is connected to an axial shaft lever 272, shown most clearly in FIG. 1. The axial shaft lever 272 is tightly secured to the axial shaft 64 via a split end construction illustrated at 274, and tightening bolt 276. As a result, movement of the bottom of the lever 272 rearwardly rotates the axial shaft 64, which in turn, rotates the chase-squeegee arm assembly to a closed position. Accordingly, upon actuation of the pneumatic cylinder 260, and is introduced over the line 261, causing the cylinder shaft to move in a rearward direction, with respect to the base 10, thereby extending the linkage 270 rearwardly to rotate the lever 272, and thereby to rotate the chase-squeegee arm assembly. When the control box 236 is signalled that a phase of operation is reached where the chase must be raised, air flow is reversed so as to be applied at the top of the pneumatic cylinder 260 via the line 278, reversing the travel of the piston 266, rotationally reversing the axial shaft lever 272, and raising the chase-squeegee arm assembly.

Again referring to FIG. 1 and FIG. 8, in the vicinity of the motor 112 there is, located at switch pad 280 bearing a "chase up" switch 282 and a print limit switch 284, sequenced in the direction of translation of the squeegee arm 84 during a print stroke. When the chase is closed, in a print stroke operation, as the arm 84 is travelling across the chase 14, the partial cylindrical bearing housing 96 makes contact with the "chase up" switch 282, thereby actuating a reversal of the pneumatic cylinder 260, withdrawing the piston 266 and linkage 270 and rotating the chase and squeegee arm assembly upwardly. Depending on the setting chosen for pneumatic raising of the chase, i.e., whether it is chosen to be relatively slow or fast, the print limits switch may or may not be actuated. With a chase that is moving up slowly, the bearing housing is carried sufficiently past the "up chase" switch 282 to actuate the print limit switch 284, which serves to switch off the motor. When the chase is moving up rapidly, the motor is reversed by means of the motor microswitch 25, heretofore described with respect to FIG. 7. Accordingly, the print limit switch 284 serves simply a safety function, preventing running of the motor when squeegee arm 84 is in an overtravel position. With the print limit switch 284 tripped, thereby stopping the motor, the motor microswitch 25 will serve to reactuate the motor, but in a reverse direction. If the print limit switch 284 is not tripped, because the chase moved up rapidly, the motor microswitch 25 serves simply to reverse the motor.

As previously described, the motor microswitch 25 is actuated by movement inwardly of the motor activating knob 252. As shown in FIG. 8, the motor activating knob 252 is connected by means of a threaded rod 286 and connecting links 288 or 290 to the pneumatic cylinder linkage 270. By rotating the knob 252, the threaded rod can be effectively lengthened or increased with respect to the distance from the connecting links 288 and 290 so as to properly position the inner surface of the knob 252 to actuate the motor microswitch 25 at a point when the chase is in a closed position and to release the motor microswitch 25 when the chase is raised.

Referring to FIG. 7 in conjunction with FIG. 8, the print stroke speed knob 246 is connected to a print control powerstat 292 connected to the motor 112. Similarly, the flood stroke speed knob 248 is connected to a flood control powerstat 294 which is also connected to the motor 112. By such means, the speed of the motor in either direction is controllable.

FIG. 8 also illustrates operation of registration elements 296, 298 and 300 connected, respectively, to registration knobs 22, 24 and 26 via rods 302, 304 and 306, respectively. The registration elements 296, 298 and 300 are secured by bolts to the table 12 secured through recesses in the top surface of the table 12 as shown at 308 and 310 in FIG. 2 (a third recess is hidden from view). The resulting registration system is not a part of the present invention as it is known, for example, on the Printmaster 5000.

The manner of operation of the silk-screening jig is illustrated schematically in FIGS. 10-13. Initially, and referring momentarily to FIG. 1, the chase is in an open position, raised somewhat higher than FIG. 10, its rearward movement limited by a stop bar 312 tightly secured to the axial shaft 64 and which impacts against a stop bar rest 314 carried on one of the U-shaped members 36. The automatic sequence is initiated by actuating the control box 236 (FIGS. 8 and 9) which may be accomplished by means of a foot switch appropriately connected thereto. As a result, air is led to the top line 254 and to the pneumatic cylinder 260 overlying 261 (FIG. 8) which by moving the linkage 270 rearwardly, thereby rotates the axial shaft lever 272 (FIG. 1). This serves to rotate the chase and squeegee arm assembly to a closed position. With specific reference to FIG. 10, because the C-clamp 66 secures both the chase 14 and squeegee arm 84, both elements rotate around the axial shaft, indicated in shadow at 64, around a common axis, indicated at 316.

Referring specifically to FIG. 10A, as one configuration in a series of sequential configurations, the chase 14 is closed against the table 12 so that the screen 30 is located on top of a work piece to be stencilled. At this stage, air that has been led through the top line 254 (FIG. 1) to the print squeegee cylinder 180 lowers the print squeegee so that its lower edge 80 is in contact with the screen adjacent a quantity of printing fluid 318, such as ink or the like. The flood squeegee 82 has been adjusted with respect to the arm 84 so that its bottom edge is a predetermined distance above the screen, indicated at 320. That distance will vary from the front of the squeegee to the rear, as indicated in FIG. 11. Also it can be seen in FIG. 10, that the forwardmost limit member follower 222 is located at the beginning of the channel 228. As soon as the chase is closed, the motor actuating knob 252 is pulled into contact with the motor microswitch 25 (FIGS. 7 and 8) whereupon the squeegee arm 84 is moved, via the chain 120 (FIG. 1) in translation across the chase 14, sweeping the printing fluid 318 across the screen 30, resulting in stencilling, i.e., silk-screening, of a work piece held on the table 12 below the screen.

At this point, the "chase up" switch 282 is contacted by the bearing housing 96 (FIGS. 7 and 8) with the result that the control box 236 diverts air from the forward pneumatic line 261 to the rear pneumatic line 278 causing the chase to be raised upwardly. Referring to FIGS. 11 and 11A, simultaneously with the diversion of air to the rear portion of the internal pneumatic cylinder 260, air is diverted from the top of the print squeegee cylinder 180 to the lower line 255 leading to the bottom of the print cylinder 180, thereby retracting the print squeegee to the position shown in FIG. 11A. At that point, either the print limit switch 284 (FIGS. 1 and 8) has been actuated to stop movement of the squeegee arm 84, or if the chase has moved up rapidly enough, the motor 112 has reversed, as previously described. At this point, the chase has been raised a distance which corresponds to the predetermined distance 320 referred to in FIG. 10A, as indicated at 320 in FIG. 11, so that the screen 30 makes contact with the bottom edge of the flood squeegee 82. At this point, although the chase 14 has been moved upwardly by reversal of air flow to the internal pneumatic cylinder 260, it is limited in its upward movement by meeting the follower 214 of the internal limit member 206. Vertical movement of the squeegee arm is limited by securement of the external limit member follower 222 in the channel 228. This arrangement permits the flood stroke to be conducted while the chase is raised above the work piece, so as to avoid double screening onto the work piece, but not so high that flooding is adversely affected.

Referring to FIG. 11B, the flood stroke is shown after its execution and it is seen that the flood squeegee 82 has swept the printing fluid 318 back across the screen 30 to its starting point. At this point, the follower 222 of the external limit member 208 is at the beginning of the channel 228 where it is releasable.

Referring to FIGS. 12 and 12A, as soon as the squeegee arm 84 is moved to a position at the original starting point where the external limit member follower 222 is free to move upwardly, the pressured pneumatic cylinder 260 is free to continue to move the chase 14 and arm 84 assembly to the open position shown in FIGS. 12 and 12A. One can then remove the stencilled work piece from the table 12 and replace it with another work piece to be stencilled. The cycle can be repeated by actuating the control box to divert air to the internal pneumatic cylinder 261.

Figure 13:
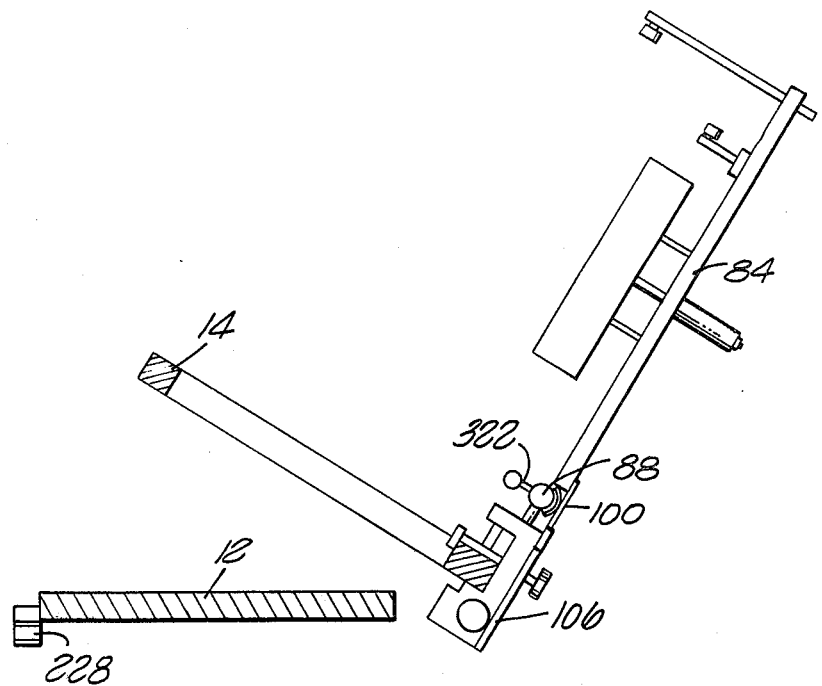
FIG. 13 is a side-cross-sectional view of the squeegee-arm assembly, chase, limit members and table, illustrating the configuration of the device when the squeegee-arm assembly has been raised away from the chase, to an obtuse angle with respect to the table.

Referring to FIG. 13, after the desired number of runs, when it is desired to either change the chase 14 or to perform any other operation thereon, the squeegee arm 84 can simply be raised further until it forms an obtuse angle with the table 12, retained by the extended portion 106 of the bridgeplate 100. At that point, one can insert a pin 322 into a central opening in the bearing bar 88, to limit forward rotational movement of the squeegee arm 84. When not in use, the pin 322 is conveniently stored in a hole 324 therefor in the idler bearing bar 8.

As required, a detailed illustrative embodiment of the invention has been disclosed. However, it is to be understood that while the embodiment as disclosed exemplifies the invention, the invention may take forms that differ somewhat from the specific embodiment. Therefore, specific structural and functional details are not necessarily to be interpreted as limiting, but as a basis for the claims.

I claim:

1. In a screener in which a chase for framing a stencil screen and having front, rear and side edges, is pivotally secured at its rear edge so as to be pivotally movable relative to a table surface, from an open position permitting a workpiece to be placed on, or withdrawn from, the table surface, to a closed position in which the screen will be in contact with the workpiece during a print stroke whereby, in the closed position, printing fluid on a first end of the screen can be spread by a squeegee and applied to the workpiece through the screen during a print stroke, whereby thereafter the chase can be moved from the closed position and the printing fluid can be swept back by a squeegee to the first end during a stroke, the improvement according to which operation of the screener is automated comprising:
   means for moving the chase to and from the open and closed positions;
   means for supporting a print squeegee and a flood squeegee over the screen whereby the bottom edge of the flood squeegee is a predetermined distance below the supporting means and whereby the print squeegee is movable below and above the bottom edge of the flood squeegee,
   means for driving the print and flood squeegees toward alternate side edges sequentially in print and flood strokes, respectively;
   means for raising the print squeegee above the bottom edge of the flood squeegee after the print stroke;
   means for raising the chase to bring the screen and the bottom edge of the flood squeegee into contact; and
   means for raising the support means with the chase after the flood stroke to enable removal of said work piece.

2. The improvement of claim 1 in which, at least at the end of the print stroke and during the flood stroke, the flood squeegee is secured at a predetermined height above the table which, prior to raising the chase, is at a distance from the screen corresponding to said first distance.

3. The improvement of claim 2 in which said means for limiting upward movement of the chase comprises a first limit member carried by said flood squeegee support means and bearing on an upper edge of the chase when said chase is raised said first distance so as to maintain the flood squeegee support means at a predetermined distance from the chase at least at the end of the print stroke and during the flood stroke.

4. The improvement of claim 3 in which the first limit member includes a follower for contact with the chase edge to facilitate translation of the first limit member across the chase edge during the flood stroke.

5. The improvement of claim 3 in which said flood squeegee support means comprises an arm extending across the chase from which the first limit member rigidly depends, and a second limit member rigidly dependent from the arm downwardly past an edge of the chase and means for preventing upward movement of the second limit member at least at the end of the print stroke and during the flood stroke whereby to limit upward movement of the arm.

6. The improvement of claim 5 in which said means for limiting movement of the second limit member comprises a flange extending parallel to the direction of movement of the print and flood strokes and including a follower on the end of the second limit member extending beneath the flange in contact therewith to prevent upward movement of the second limit member while facilitating translation of the second limit member thereacross.

7. The improvement of claim 6 in which the flange constitutes the upper edge of a channel, the second limit member follower extending into said channel thereby preventing vertical movement of the second limit member.

8. The improvement of claim 6 in which the flange is discontinuous at a region corresponding to the end of the blood stroke whereby to release the second limit member thereat, permitting the chase to be raised to the open position.

9. The improvement of claim 1 in which said means for supporting the print and flood squeegees comprises at least one arm, extending across said chase, from which the squeegees depend, and a limit member rigidly dependent from the arm extending downwardly past an edge of the table, and means for preventing vertical movement of the limit member during the print and flood strokes.

10. The improvement of claim 9 including means for releasing the limit member at the end of the flood stroke to permit the chase to be raised to the open position.

11. The improvement of claim 9 in which said means for preventing vertical movement of the limit member comprises a channel extending parallel to the direction of movement of the print and flood strokes and including a follower on the end of the limit member extending into the channel to prevent vertical movement of the limit member while facilitating translation of the limit member thereacross.

12. The improvement of claim 11 in which the channel has a discontinuous portion at a region corresponding to the end of the flood stroke to release the limit member thereat, permitting the chase to be raised to the open position.

13. The improvement of claim 1 in which said means for supporting the flood squeegee over the screen comprises means for adjusting the vertical position of the flood squeegee to said first distance from the screen when the chase is in the closed position and immobilizing said blood squeegee against downward movement relative to the table, at said adjusted position, whereby contact between the flood squeegee and the screen can be made by raising the chase said first distance.

14. The improvement of claim 13 including means for spring-loading the flood squeegee against upward movement relative to the table.

15. The improvement of claim 14 in which said spring-loading is sufficient to withstand the upward force of flooding pressure.

16. The improvement of any one of claims 13-15 in which the adjusting means is formed to permit the front of the flood squeegee to be at a higher position than the rear of the flood squeegee relative to the table so that the angle formed by the bottom of the flood squeegee relative to the table corresponds to the angle defined by raising the chase said first distance.

17. The improvement of claim 16 in which the front of the flood squeegee can be adjusted independently of adjustment of the position of the rear of the flood squeege.

18. The improvement of claim 1 in which the means for driving the print and flood squeegees comprises a reversible motor.

19. The improvement of claim 18 including means, responsive to raising to the chase said first distance, for reversing said motor from a print stroke direction to a flood stroke direction.

20. The improvement of claim 1 in which said means for retracting the print squeegee from the screen comprises a pneumatic cylinder having a shaft connected to the print squeegee, and switch means responsive to the end of a print stroke for actuating the cylinder to retract the print squeegee.

21. The improvement of claim 20 including means for adjusting the height of the front and rear edges of the print squeegee.

22. The improvement of claim 1 in which said means for supporting the print and flood squeegees comprises an arm pivotally connected to one side of the chase and extending across the chase to the other side thereof, said squeegee depending from the arm, the arm being rotatable to an obtuse angle with respect to the table and the chase is in the open position.

23. The improvement of claim 1 in which said means for supporting the print and flood squeegees comprises an arm extending across the chase and including a bearing bar extending along the rear edge of the chase, spaced from the top surface thereof, and means for slidably securing the arm at its rear end to the bearing bar to move therealong in translation across the chase.

24. The improvement of claim 23 including means for rigidly securing the bearing bar to the chase to pivot therewith about said pivot axis.

25. The improvement of claim 24 in which said chase is pivotally secured by an axial shaft below the rear edge of the chase extending along at least a portion thereof, and including a pair of clamp members rigidly securing the chase to the axial shaft, said clamp members being rigidly secured to the bottom of the bearing bar.

26. The improvement of any one of claims 23-25 in which said means for slidably securing the arm is pivotal about the bearing bar whereby the arm may be rotated upwardly about the bearing bar.

27. The improvement of claim 26 in which the bearing bar is cylindrical and said means for slidably securing the arm comprises a partially cylindrical bearing slidably and pivotally disposed on the bearing bar.

28. The improvement of claim 23 in which said means for driving the print and flood squeegees comprises a drive chain extending along the rear edge of the chase, a motor connected to drive the chain and means on the rear end of the arm for connecting the arm to the chain.

29. The improvement of claim 28 in which said means for slidably securing the arm is pivotal about the bearing bar whereby the arm may be rotated upwardly about the bearing bar, and said means for connecting the arm to the chain comprises a pin bearing member carrying on its upper surface at least one pin for linking with the chain and means for hingedly connecting the pin-bearing member to the top rear surface of the arm whereby as the arm is rotated upwardly, the pin-bearing member moves in a vertically downward direction while remaining horizontal for release from the chain.

30. In a screener in which a chase for framing a stencil screen is pivotally secured at a rear edge for rotatable movement upwardly relative to a table surface, from an open position permitting a workpiece that is to be placed on, or withdrawn from, the table surface to a closed position in which the screen will be in contact during a print stroke with a workpiece whereby, in the closed position, printing fluid on a first end of the screen can be spread by a squeegee and applied to the workpiece through the screen during a print stroke, and whereby thereafter the chase can be rotated upwardly from the closed position and the print fluid can be swept back by a squeegee to the first end during a flood stroke, the improvement according to which operation of the screener is automated, comprising:

means for moving the chase to and from the open and closed position;

an axial shaft below the rear edge of the chase and extending along at least a portion thereof;

a pair of clamp members rigidly securing the chase to the axial shaft;

a cylindrical bearing bar extending across the rear edge of the chase, rigidly secured to the clamp members and spaced from the top surface of the chase;

a partially cylindrical bearing slidably and pivotally disposed on the bearing bar;

an arm extending across the chase rigidly secured to the partially cylindrical bearing so as to slide in translation across the chase to pivot about the bearing bar whereby the arm is rotatable to an obtuse angle with respect to the table when the chase is in the open position;

a drive chain extending along the rear edge of the chase;

a motor connected to drive the chain;

a pin-bearing member carrying on its upper surface at least one pin for linking with the chain;

means for hingedly connecting the pin-bearing member to the top rear surface of the arm whereby as the arm is rotated upwardly, the pin bearing member moves in a vertically downward direction, while remaining horizontal for release from the chain;

means for supporting a print squeegee and a flood squeegee;

means for securing the print squeegee over the screen, comprising a pneumatic cylinder secured to the arm and having a piston shaft extending downwardly therefrom and connected to said print squeegee, and means for adjusting the height of the front and rear edges of the print squeegee, whereby the print squeegee is movable above and below the bottom edge of the flood squeegee and is retractable after a print stroke and whereby when the chase is in the closed position, the bottom edge of the print squeegee is in contact with the screen;

switch means responsive to the end of a print stroke for actuating the pneumatic cylinder to retract the print squeegee;

adjustable spring-loaded means for supporting the flood squeegee over the screen spaced therefrom when the chase is in the closed position whereby contact between the flood squeegee and the chase can be made by raising the chase a first predetermined distance which is a minor fraction of the distance from the table surface to the open position, the adjustable supporting means being formed to permit the front of the flood squeegee to be at a higher position than the rear of the flood squeegee relative to the table so that the angle formed by the bottom of the flood squeegee relative to the table corresponds to the angle defined by raising the chase said first distance;

a first limit member rigidly dependent from the arm, having a follower on its lower edge for contacting the top surface of the follower edge of the chase when the chase is raised said first distance;

a second limit member rigidly dependent from the arm downwardly past the edge of the chase and formed with a follower; and a channel member parallel to the direction of translation of the arm, formed to receive the follower of the second limit member and disposed to limit vertical movement of the arm during the print and flood strokes, thereby limiting upward movement of the chase to said first distance where the chase contacts the follower of the first limit member, the channel member having a discontinuous portion at a region corresponding to the end of the flood stroke to release the second limit member thereat, permitting the chase to be raised to the open position to enable removal of said workpiece.

* * * * *